US 6,709,931 B2

(12) United States Patent
Kim

(10) Patent No.: US 6,709,931 B2
(45) Date of Patent: Mar. 23, 2004

(54) FABRICATION OF SEMICONDUCTOR DEVICES HAVING HIGH-VOLTAGE MOS TRANSISTORS AND LOW-VOLTAGE MOS TRANSISTORS

(75) Inventor: Sung-Hoan Kim, Suwon (KR)

(73) Assignee: Samsung Electronics, Co., Ltd., Suwon-si (KR)

( * ) Notice: Subject to any disclaimer, the term of this patent is extended or adjusted under 35 U.S.C. 154(b) by 0 days.

(21) Appl. No.: 10/184,791

(22) Filed: Jun. 28, 2002

(65) Prior Publication Data

US 2003/0067050 A1 Apr. 10, 2003

(30) Foreign Application Priority Data

Oct. 4, 2001 (KR) ........................................ 2001-61186

(51) Int. Cl.⁷ ...................... H01L 21/2834; H01L 21/31
(52) U.S. Cl. .................. 438/275; 438/787; 438/981
(58) Field of Search ................. 438/275, 787, 438/981, 199, 218

(56) References Cited

U.S. PATENT DOCUMENTS

| | | | | |
|---|---|---|---|---|
| 5,254,489 A | * | 10/1993 | Nakata | 438/258 |
| 5,502,009 A | * | 3/1996 | Lin | 438/275 |
| 5,861,347 A | * | 1/1999 | Maiti et al. | 438/787 |
| 6,225,167 B1 | * | 5/2001 | Yu et al. | 438/275 |
| 6,300,197 B1 | * | 10/2001 | Inaba | 438/258 |
| 6,391,701 B1 | * | 5/2002 | Inoue | 438/225 |

FOREIGN PATENT DOCUMENTS

| | | | |
|---|---|---|---|
| JP | 10178102 | | 6/1998 |
| JP | 2001308198 | * | 11/2001 |
| JP | 2002313941 | * | 10/2002 |

* cited by examiner

Primary Examiner—John Niebling
Assistant Examiner—Ron Pompey
(74) Attorney, Agent, or Firm—F. Chau & Associates, LLP

(57) ABSTRACT

Methods of fabricating a semiconductor device having low-voltage MOS transistors and high-voltage metal-oxide semiconductor ("MOS") transistors are provided. The method includes forming a device isolation layer at a predetermined region of a semiconductor substrate. The device isolation layer defines first and second active regions in low and high-voltage MOS transistor regions, respectively. A capping layer pattern is formed to cover the low-voltage MOS transistor region. The capping layer pattern exposes the second active region in the high-voltage MOS transistor region. A first gate oxide layer is formed on an entire surface of the semiconductor substrate having the capping layer pattern. The first gate oxide layer is formed using a chemical vapor deposition ("CVD") technique. The first gate oxide layer serves as a gate insulating layer of the high-voltage MOS transistor. The first gate oxide layer in the low-voltage MOS transistor region and the capping layer pattern are then etched to expose the first active region. A second gate oxide layer is formed using a thermal oxidation technique on the first active region. The second gate oxide layer is formed to a thickness, which is thinner than the first gate oxide layer. The second gate oxide layer serves as a gate insulating layer of the low-voltage MOS transistor.

17 Claims, 4 Drawing Sheets

FABRICATION OF SEMICONDUCTOR DEVICES HAVING HIGH-VOLTAGE MOS TRANSISTORS AND LOW-VOLTAGE MOS TRANSISTORS

CROSS-REFERENCE TO RELATED APPLICATION

This application claims priority from Korean Patent Application No. 2001-61186, filed on Oct. 4, 2001, the contents of which are herein incorporated by reference in their entirety.

FIELD OF THE INVENTION

The present invention generally relates to methods of fabricating a semiconductor device and, more particularly, to methods of fabricating a semiconductor device having high-voltage metal-oxide semiconductor ("MOS") transistors and low-voltage MOS transistors.

BACKGROUND OF THE INVENTION

Semiconductor devices such as non-volatile memory devices and liquid crystal display ("LCD") driver integrated circuits typically employ at least two kinds of metal-oxide semiconductor ("MOS") transistors. One is a low-voltage MOS transistor and the other is a high-voltage MOS transistor. An operating voltage of the low-voltage MOS transistor is lower than that of the high-voltage MOS transistor. For example, the low-voltage MOS transistor typically operates at a power supply voltage that is lower than 5V, whereas the high-voltage MOS transistor typically operates at a power supply voltage that is within the range of 10V to 30V. Accordingly, a gate insulating layer of the high-voltage MOS transistor should be thicker than that of the low-voltage MOS transistor.

Meanwhile, in order to fabricate a semiconductor device, a device isolation layer should be formed to define an active region. The device isolation layer may be formed using a local oxidation of silicon ("LOCOS") isolation technique or a shallow trench isolation ("STI") technique. In the event that the LOCOS isolation technique is employed in fabrication of highly integrated semiconductor devices, the semiconductor devices typically suffer from problems, such as, for example, those due to a "bird's beak" as known in the art. Thus, the STI isolation technique has been widely used in fabrication of the highly integrated semiconductor devices. However, when the device isolation layer of the semiconductor device is formed using the STI technique, an edge of the device isolation layer is easily recessed. In this case, even if a subthreshold voltage is applied to a gate electrode of the MOS transistor, an undesired leakage current may flow between a source and a drain of the MOS transistor. Furthermore, in the event that a thick thermal oxide layer having a thickness of 300 to 500 Å is grown on the active region in order to form the gate insulating layer of the high-voltage MOS transistor, the gate insulating layer on an upper corner of the trench region is formed to a thickness which is less than that of the gate insulating layer on a center region of the active region. Hereinafter, this phenomenon is referred as the "thinning effect".

SUMMARY OF THE INVENTION

The present invention provides for fabrication of semiconductor devices while improving the reliability of a low-voltage metal-oxide semiconductor ("MOS") transistor as well as improving the thinning effect of a gate insulating layer of a high-voltage MOS transistor.

Features of the invention can be achieved by methods of fabricating a semiconductor device having low-voltage MOS transistors and high-voltage MOS transistors. The method comprises providing a semiconductor substrate having first and second regions. A device isolation layer is formed at a predetermined region of the semiconductor substrate to define first and second active regions in the first and second regions, respectively. A capping layer is formed on an entire surface of the resultant structure where the device isolation layer is formed. The capping layer is patterned to expose the second active region and to form a capping layer pattern covering the first region. A first gate oxide layer is formed using a chemical vapor deposition ("CVD") technique on an entire surface of the semiconductor substrate having the capping layer pattern. Thus, the first gate oxide layer having a uniform thickness is formed throughout the second active region. This is not that the first gate oxide layer is formed by a thermal growing mechanism, but that the first oxide layer is formed by a chemical deposition mechanism. As a result, the first gate oxide layer is formed even on the capping layer pattern in the first region. The first gate oxide layer in the first region and the capping layer pattern are successively etched to expose the first active region. The resultant structure where the first active region is exposed is then thermally oxidized to form a second gate oxide layer, which is thinner than the first gate oxide layer, on the first active region.

The first region corresponds to a region that has a pattern density, which is higher than that of the second region. For example, the first region may be a low-voltage MOS transistor region, and the second region may be a high-voltage MOS transistor region.

According to a first embodiment of the present invention, the device isolation layer can be formed using a shallow trench isolation ("STI") technique. In addition, the capping layer is preferably formed of a silicon nitride layer.

DESCRIPTION OF THE PREFERRED EMBODIMENT

Figure 1:
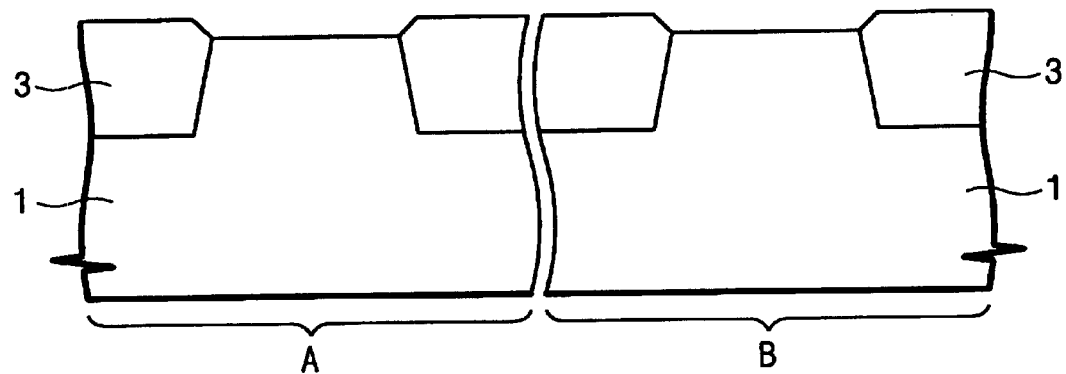
FIGS. 1 through 3 are cross-sectional views for explaining a method of fabricating a semiconductor device in accordance with a prior art.
Figure 2:
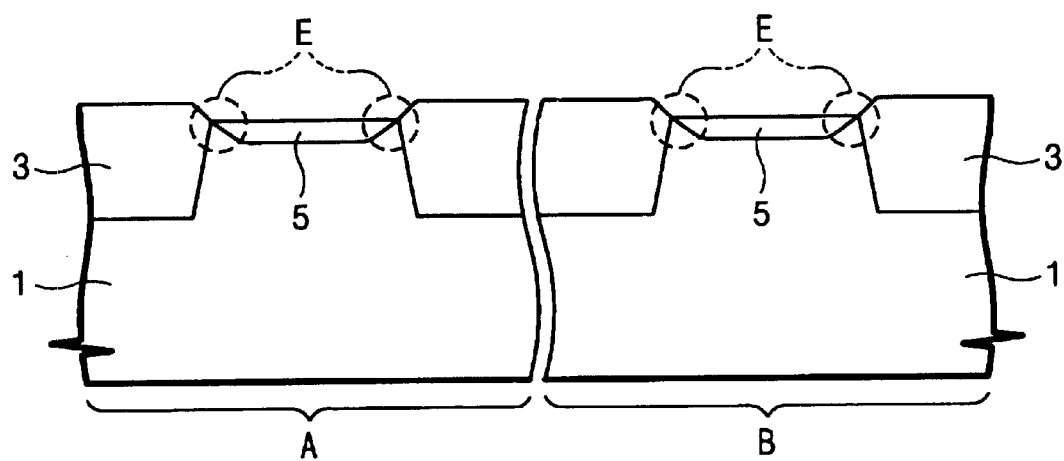
Figure 3:
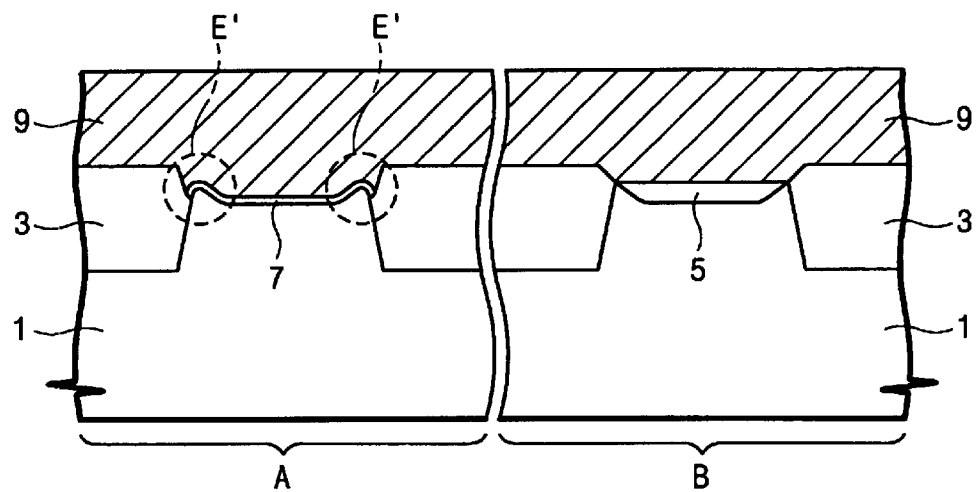

The present invention will now be described more fully hereinafter with reference to the accompanying drawings, in which preferred embodiments of the invention are shown. FIGS. 1 through 3 show cross-sectional views for explaining a conventional method of fabricating a semiconductor device having a low-voltage MOS transistor and a high-voltage MOS transistor. In each of the drawings, portions denoted by reference numerals "A" and "B" illustrate low-voltage and high-voltage MOS transistor regions, respectively.

Referring to FIGS. 1 and 2, a device isolation layer 3 is formed at a predetermined region of a semiconductor substrate 1 to define active regions. The device isolation layer 3 is formed using the STI technique. The semiconductor substrate having the device isolation layer 3 is thermally oxidized to form a first gate oxide layer 5 on the active regions. The first gate oxide layer 5 corresponds to a gate insulating layer of the high-voltage MOS transistor. Accordingly, the first gate oxide layer 5 is formed to a thickness of at least 300 Å. At this time, the first gate oxide layer 5 has a non-uniform thickness as shown in FIG. 2. That is, the first gate oxide layer 5 formed at an edge E of the active region has a thickness, which is less than 300 Å. This is because a growth rate of the first gate oxide layer 5 formed on a center of the active region is higher than that of the first gate oxide layer 5 formed at the edge E of the active region. As a target thickness of the first gate oxide layer 5 increases, a thickness uniformity of the first gate oxide layer 5 becomes even worse.

Referring to FIG. 3, the first gate oxide layer 5 in the low-voltage MOS transistor region A is selectively removed to expose the active region in the low-voltage MOS transistor region A. At this time, an edge E' of the device isolation layer 3 in the low-voltage MOS transistor region A may be recessed. This is due to an over-etching for selectively removing the first gate oxide layer 5. As a result, a sharply protruded portion may be formed at an edge of the active region in the low-voltage MOS transistor region A.

Subsequently, the resultant structure where the active region in the low-voltage MOS transistor region A is exposed is thermally oxidized to form a second gate oxide layer 7 on the exposed active region. The second gate oxide layer 7 is formed to a thickness of 100 Å or less. The second gate oxide layer 7 acts as a gate insulating layer of the low-voltage MOS transistor. At this time, since a surface of the active region in the high-voltage MOS transistor region B is covered with the first gate oxide layer 5 having a thickness of 300 Å or more, the active region in the high-voltage MOS transistor region A is hardly oxidized. Accordingly, a difference between a final thickness of the first gate oxide layer 5 and an initial thickness thereof is smaller than the thickness of the second gate oxide layer 7.

A gate conductive layer 9 is formed on an entire surface of the resultant structure where the second gate oxide layer 7 is formed. Although not shown in the drawing, the gate conductive layer 9 is then patterned to form first and second gate electrodes in the high and low-voltage MOS transistor regions B and A, respectively. In this case, a residue of the gate conductive layer 9 may remain in the recessed region formed at the edge of the device isolation layer 3 in the low-voltage MOS transistor region A.

Thus, the protruded portion is formed at the edge of the active region in the low-voltage MOS transistor region. In addition, the recessed region is formed at the edge of the device isolation layer adjacent to the protruded portion. This leads to a degradation of a characteristic of the low-voltage MOS transistor formed in the low-voltage MOS transistor region as well as a generation of a conductive bridge between the adjacent gate electrodes. Furthermore, it is difficult to prevent the thinning effect of the gate insulating layer from being generated in the high-voltage MOS transistor region.

FIGS. 4 through 8 show cross-sectional views for explaining a method of fabricating a semiconductor device according to a preferred embodiment of the present invention. In each of the drawings, portions denoted by reference numerals "A" and "B" illustrate first and second regions, respectively. In this embodiment, the first region A corresponds to a low-voltage metal-oxide semiconductor ("MOS") transistor region, the second region B corresponds to a high-voltage MOS transistor region.

Figure 4:
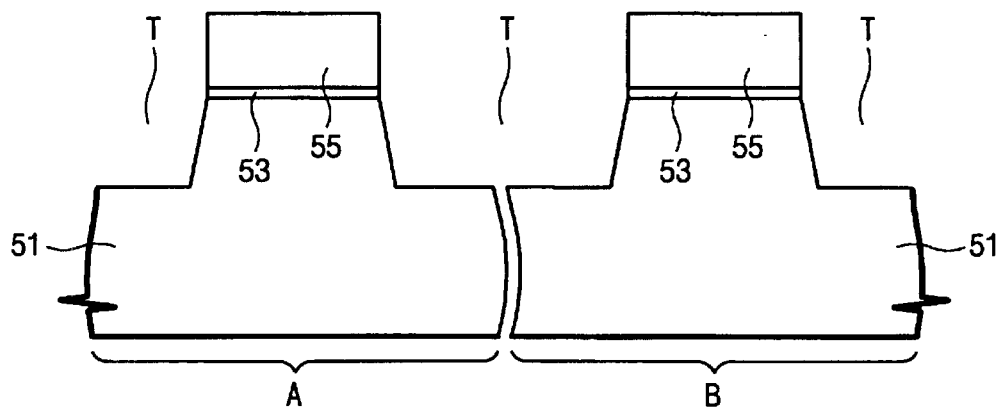
FIGS. 4 through 8 are cross-sectional views for explaining a method of fabricating a semiconductor device in accordance with a preferred embodiment of the present invention.

Referring to FIG. 4; a pad oxide layer and a pad nitride layer are sequentially formed on an entire surface of a semiconductor substrate 51. The pad nitride layer and the pad oxide layer are successively patterned to form a pad oxide layer pattern 53 and a pad nitride layer pattern 55 that expose a predetermined region of the semiconductor substrate 51. The exposed semiconductor substrate 51 is then etched to form a trench region T. The trench region T defines first and second active regions in the low and high-voltage MOS transistor regions A and B, respectively.

Figure 5:
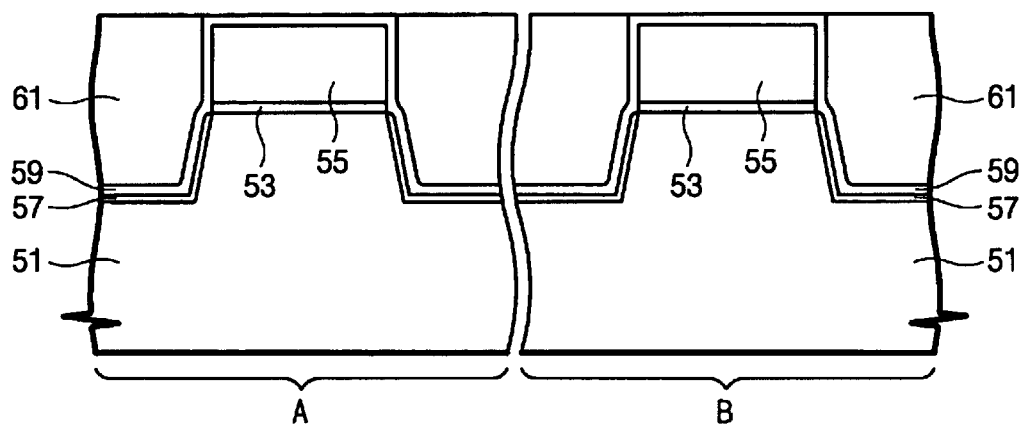

Referring to FIG. 5, the semiconductor substrate having the trench region T is thermally oxidized to form a thermal oxide layer liner 57 on an inner wall of the trench region T. The thermal oxide layer liner 57 is formed to cure etching damage which is applied to the substrate 51 during formation of the trench region T. A conformal silicon nitride layer 59 may be further formed on an entire surface of the resultant structure having the thermal oxide layer liner 57. The silicon nitride layer 59 serves as an oxidation barrier layer that prevents the inner wall of the trench region T from being additionally oxidized during a subsequent thermal process.

An insulating layer filling the trench region T is formed on an entire surface of the semiconductor substrate including the silicon nitride layer 59. It is preferable that the insulating layer is formed of a high density plasma ("HDP") oxide layer or an undoped silicate glass ("USG") layer. The insulating layer is planarized until the pad nitride layer pattern 55 or the nitride layer 59 thereon is exposed. As a result, an insulating layer pattern 61 is formed in the trench region T. The insulating layer pattern 61 corresponds to a device isolation layer.

Figure 6:
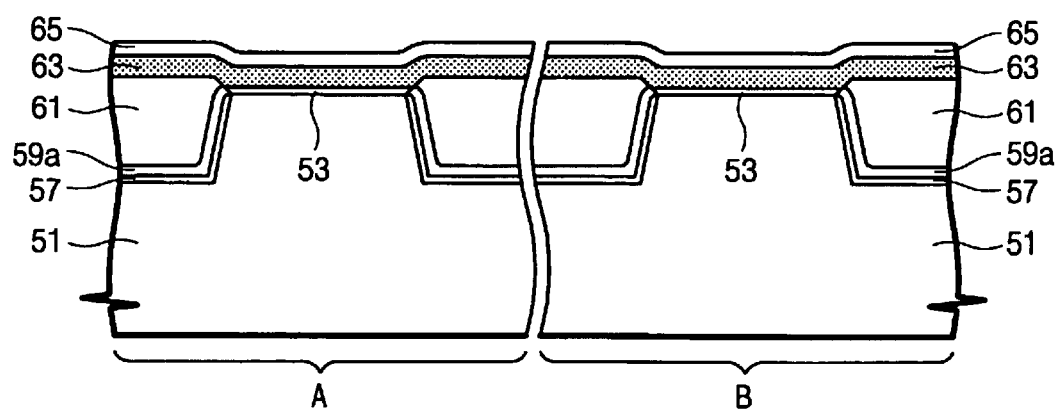

Referring to FIG. 6, the pad nitride layer pattern 61 is removed to expose the pad oxide layer pattern 53. Using the exposed pad oxide layer pattern 53 as a screen oxide layer, impurity ions are implanted into the first and second active regions to adjust threshold voltages of the low and high-voltage MOS transistors and to prevent punchthrough thereof. Alternatively, after removing the pad nitride layer pattern 55 and the pad oxide layer pattern 53, a sacrificial oxide layer having a thickness of 100 Å or less may be formed on the first and second active regions. Ion implantation processes for adjusting the threshold voltages and preventing the punchthrough are then implemented into the first and second active regions using the sacrificial oxide layer as the screen oxide layer.

A capping layer 63 is formed on an entire surface of the resultant structure where the ion implantation processes are completed. It is preferable that the capping layer 63 is formed of a material layer having an etch selectivity with respect to an oxide layer. For instance, the capping layer 63 is preferably formed of a silicon nitride layer. In addition, a capping oxide layer 65 may be further formed on the capping layer 63. The capping oxide layer 65 is preferably formed of a CVD oxide layer.

Figure 7:
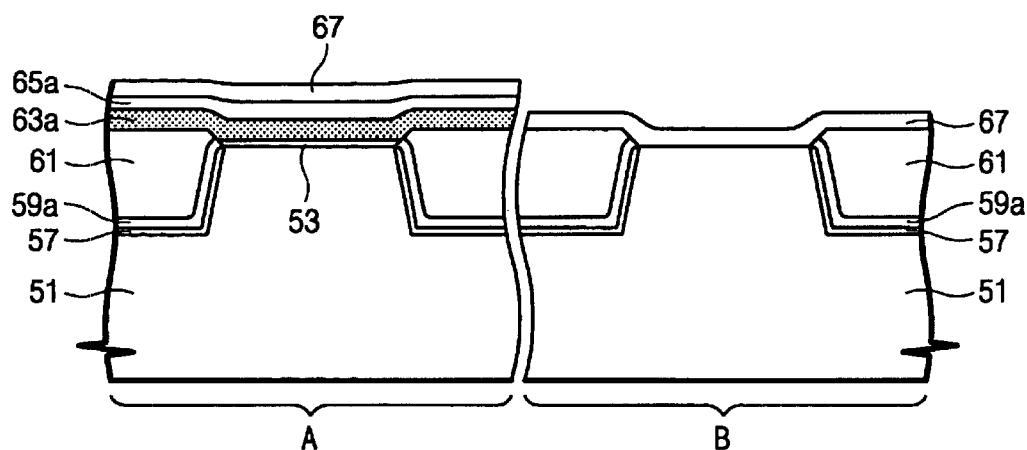

Referring to FIG. 7, the capping oxide layer 65 is patterned to form a capping oxide layer pattern 65a that exposes the capping layer 63 in the high-voltage MOS transistor region B. The exposed capping layer 63 is then etched using the capping oxide layer pattern 65a as an etch mask. As a result, a capping layer pattern 63a is formed to cover the low-voltage MOS transistor region A. The capping layer 63 is preferably etched using a wet etching process. The screen oxide layer that exists on the second active region is then removed to expose the second active region.

A first gate oxide layer 67 is formed on an entire surface of the resultant structure where the second active region is exposed. The first gate oxide layer 67 is preferably formed using a CVD process. Furthermore, the first gate oxide layer 67 is formed to a thickness that is suitable for the high-voltage MOS transistor. For example, the first gate oxide layer may be formed to a thickness of 300 to 1000 Å. In the event that the first gate oxide layer 67 is formed using the CVD technique, the first gate oxide layer 67 has a uniform thickness throughout the second active region, as shown in FIG. 7. This is because the first gate oxide layer 67 is formed by the CVD technique that is different from the thermal oxidation technique.

Figure 8:
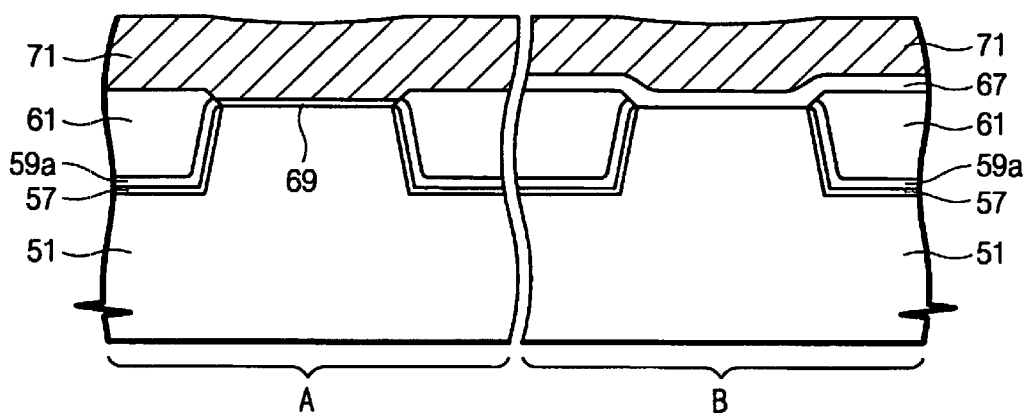

Referring to FIG. 8, a mask pattern covering the high-voltage MOS transistor region B is formed on the first gate oxide layer 67. The mask pattern may be formed of a photoresist pattern using a conventional photolithography technique. The first gate oxide layer 67 and the capping oxide layer pattern 65a in the low-voltage MOS transistor region A are successively etched to expose the capping layer pattern 63a in the low-voltage MOS transistor region A. The capping layer pattern 63a is then etched to expose the screen oxide layer on the first active region. At this time, since the capping layer pattern 63a has the etching selectivity with respect to the oxide layer, it is possible to prevent recessed regions from being formed at the edge of the device isolation layer. The first gate oxide layer 67, the capping oxide layer pattern 65a and the capping layer pattern 63a in the low-voltage MOS transistor region A are preferably etched using wet etch processes. The screen oxide layer remaining on the first active region is then removed to expose the first active region.

The mask pattern is removed. The resultant structure where the mask pattern is removed is thermally oxidized to form a second gate oxide layer 69 on the first active region. The second gate oxide layer 69 is formed of a thickness of 100 Å or less. In this case, since the second active region is covered with the first gate oxide layer 67 having a thickness of 300 Å or more, a surface of the second active region is hardly oxidized. Therefore, a difference between an initial thickness of the first gate oxide layer 67 and a final thickness thereof is smaller than the thickness of the second gate oxide layer 69. In addition, the first gate oxide layer 67 is densified during the thermal oxidation for forming the second gate oxide layer 69. As a result, a film quality of the first gate oxide layer 69 formed of the CVD oxide layer is improved. Meanwhile, the thinning effect of the second gate oxide layer 69 may be remarkably alleviated at the edge of the first active region, since the second gate oxide layer 69 is formed to a thin thickness of 100 Å or less.

A gate conductive layer 71 is formed on an entire surface of the substrate having the second gate oxide layer 69. Although not shown in the figure, the gate conductive layer 71 is then patterned to form first and second gate electrodes, which are crossing over the first and second active regions, respectively. The first gate electrode corresponds to a gate electrode of the low-voltage MOS transistor and the second gate electrode corresponds to a gate electrode of the high-voltage MOS transistor. At this time, as shown in FIG. 8, the recessed region does not exist at the edge of the device isolation layer 61. Therefore, it is possible to prevent a bridge or a stringer composed of the gate conductive layer between the adjacent gate electrodes from being formed.

According to the present invention as described above, the gate insulating layer of the high-voltage MOS transistors is formed of a CVD oxide layer and the gate insulating layer of the low-voltage MOS transistor is formed of a thermal oxide layer. Thus, the thinning effect of the gate insulating layers may be remarkably alleviated. In addition, in the event that the first active region in the low-voltage MOS transistor region is exposed, the capping nitride layer pattern is used as an etch stop layer. Thus, it is possible to prevent a recessed region from being formed at the edge of the device isolation layer in the low-voltage MOS transistor region. As a result, it is possible to prevent a bridge between the adjacent gate electrodes from being formed.

These and other features and advantages of the present disclosure may be readily ascertained by one of ordinary skill in the pertinent art based on the teachings herein. It is to be understood that the teachings of the present disclosure may be implemented in various forms of hardware, software, firmware, special purpose processors, or combinations thereof.

The teachings of the present disclosure may be implemented as a combination of hardware and software. Moreover, the software is preferably implemented as an application program tangibly embodied on a program storage unit. The application program may be uploaded to, and executed by, a machine comprising any suitable architecture. Preferably, the machine is implemented on a computer platform having hardware such as one or more Central Processing Units ("CPUs"), a Random Access Memory ("RAM"), and Input/Output ("I/O") interfaces. The computer platform may also include an operating system and microinstruction code. The various processes and functions described herein may be either part of the microinstruction code or part of the application program, or any combination thereof, which may be executed by a CPU. In addition, various other peripheral units may be connected to the computer platform such as an additional data storage unit and an output unit.

It is to be further understood that, because some of the constituent system components and steps depicted in the accompanying drawings may be implemented in software, the actual connections between the system components or the process function blocks may differ depending upon the manner in which the present disclosure is programmed. Given the teachings herein, one of ordinary skill in the pertinent art will be able to contemplate these and similar implementations or configurations of the present disclosure.

As will be recognized by those of ordinary skill in the pertinent art based on the teachings herein, alternate embodiments are possible. Given the teachings of the disclosure provided herein, those of ordinary skill in the pertinent art will contemplate various alternate configurations and implementations of the system while practicing within the scope and spirit of the present disclosure.

Although the illustrative embodiments have been described herein with reference to the accompanying drawings, it is to be understood that the present disclosure is not limited to those precise embodiments, and that various changes and modifications may be effected therein by one of ordinary skill in the pertinent art without departing from the scope or spirit of the present disclosure. All such changes and modifications are intended to be included within the scope of the present disclosure as set forth in the appended claims.

What is claimed is:

1. A method of fabricating a semiconductor device, the method comprising:

providing a semiconductor substrate having first and second regions;

forming a device isolation layer at a predetermined region of the semiconductor substrate to define first and second active regions in the first and second regions, respectively;

forming a capping layer on an entire surface of the substrate having the device isolation layer;

patterning the capping layer to form a capping layer pattern that exposes the second active region and covers the first region;

forming a first gate oxide layer on an entire surface of the substrate including the capping layer pattern, the first gate oxide layer being formed using a chemical vapor deposition technique;

successively etching the first gate oxide layer in the first region and the capping layer pattern to expose the first active region; and thermally oxidizing the resultant structure to form a second gate oxide layer on the first active region, the second gate oxide layer being formed to a thickness which is thinner than the first gate oxide layer.

2. The method as claimed in claim 1, wherein the first region has a higher pattern density than the second region.

3. The method as claimed in claim 1, wherein the device isolation layer is formed using a shallow trench isolation technique.

4. The method as claimed in claim 3, wherein forming the device isolation layer comprises:

sequentially forming a pad oxide layer and a pad nitride layer on an entire surface of the semiconductor substrate having the first and second regions;

patterning the pad nitride layer and the pad oxide layer to form a pad oxide layer pattern and a pad nitride layer pattern that expose a predetermined region of the semiconductor substrate;

etching the exposed semiconductor substrate to form a trench region that defines the first and second active regions in the first and second regions, respectively;

forming an insulating layer pattern that fills the trench region; and removing the pad nitride layer pattern.

5. The method as claimed in claim 4, wherein the pad oxide layer pattern remains on the first and second active regions after removing the pad nitride layer pattern, the pad oxide layer pattern remaining on the second active region is removed prior to formation of the first gate oxide layer and the pad oxide layer pattern remaining on the first active region is removed prior to formation of the second gate oxide layer.

6. The method as claimed in claim 4, wherein removing the pad nitride layer pattern is followed by:

removing the pad oxide layer pattern remaining on the first and second active regions to expose the first and second active regions; and forming a sacrificial oxide layer on the exposed first and second active regions, wherein the sacrificial oxide layer formed on the second active region is removed prior to formation of the first gate oxide layer, and the sacrificial oxide layer formed on the first active region is removed prior to formation of the second gate oxide layer.

7. The method as claimed in claim 1, wherein the capping layer is formed of a silicon nitride layer.

8. The method as claimed in claim 1 further comprises forming a capping oxide layer on the capping layer using a chemical vapor deposition technique, wherein the capping oxide layer is patterned together with the capping layer, and the patterned capping oxide layer is removed during etching process of the first gate oxide layer and the capping layer pattern in the first region.

9. The method as claimed in claim 1, wherein the first gate oxide layer in the first region is etched using a wet etching technique.

10. The method as claimed in claim 1, wherein forming the second gate oxide layer is followed by:

forming a gate conductive layer on an entire surface of the substrate having the second gate oxide layer; and patterning the gate conductive layer to form first and second gate electrodes which are crossing over the first and second active regions, respectively.

11. A method of fabricating a semiconductor device having a low-voltage metal-oxide semiconductor ("MOS") transistor region and a high-voltage MOS transistor region, the method comprising:

forming a trench isolation layer at a predetermined region of a semiconductor substrate to define first and second active regions in the low and high-voltage MOS transistor regions, respectively;

forming a capping nitride layer on an entire surface of the semiconductor substrate having the trench isolation layer;

patterning the capping nitride layer to form a capping nitride layer pattern that exposes the second active region and covers the low-voltage MOS transistor region;

forming a first gate oxide layer on an entire surface of the semiconductor substrate including the capping nitride layer pattern, the first gate oxide layer being formed of a chemical vapor deposition technique;

successively etching the first gate oxide layer in the low-voltage MOS transistor region and the capping nitride layer pattern to expose the first active region; and thermally oxidizing the resultant structure where the first active region is exposed to form a second gate oxide layer on the first active region, the second gate oxide layer being formed to a thickness which is thinner than the first gate oxide layer.

12. The method as claimed in claim 11, wherein forming the trench isolation layer comprises:

sequentially forming a pad oxide layer and a pad nitride layer on an entire surface of the semiconductor substrate;

patterning the pad nitride layer and the pad oxide layer to form a pad oxide layer pattern and a pad nitride layer pattern that expose a predetermined region of the semiconductor substrate;

etching the exposed semiconductor substrate to form a trench region that defines the first and second active regions in the low and high-voltage MOS transistor regions, respectively;

forming an insulating layer pattern that fills the trench region; and removing the pad nitride layer pattern.

13. The method as claimed in claim 12, wherein the pad oxide layer pattern remains on the first and second active regions after removing the pad nitride layer pattern, wherein the pad oxide layer pattern remaining on the second active region is removed prior to formation of the first gate oxide layer, and the pad oxide layer pattern remaining on the first active region is removed prior to formation of the second gate oxide layer.

14. The method as claimed in claim 12, wherein removing the pad nitride layer pattern is followed by:

removing the pad oxide layer pattern remaining on the first and second active regions to expose the first and second active regions; and forming a sacrificial oxide layer on the exposed first and second active regions, wherein the sacrificial oxide layer formed on the second active region is removed prior to formation of the first gate oxide layer, and the sacrificial oxide layer formed on the first active region is removed prior to formation of the second gate oxide layer.

15. The method as claimed in claim 11 further comprises forming a capping oxide layer on the capping nitride layer using a chemical vapor deposition technique, wherein the capping oxide layer is patterned together with the capping nitride layer, and the patterned capping oxide layer is removed during etching process of the first gate oxide layer in the low-voltage MOS transistor region and the capping nitride layer pattern.

16. The method as claimed in claim 11, wherein the first gate oxide layer in the low-voltage MOS transistor region is etched using a wet etching technique.

17. The method as claimed in claim 11, wherein forming the second gate oxide layer is followed by:

forming a gate conductive layer on an entire surface of the resultant structure having the second gate oxide layer; and patterning the gate conductive layer to form first and second gate electrodes which are crossing over the first and second active regions, respectively.

* * * * *